United States Patent [19]

Kawabata et al.

[11] 4,223,968

[45] Sep. 23, 1980

[54] HIGH-FREQUENCY ETCHED CIRCUIT BOARD CONNECTOR

[75] Inventors: Frederick Y. Kawabata, Beaverton; William M. Wane, Portland, both of Oreg.

[73] Assignee: Tektronix, Inc., Beaverton, Oreg.

[21] Appl. No.: 36,968

[22] Filed: May 8, 1979

[51] Int. Cl.[3] .......................... H05K 1/07; H05K 1/12

[52] U.S. Cl. ............................... 339/14 R; 339/17 L; 339/17 LC

[58] Field of Search ................ 339/14 R, 17 R, 17 M, 339/17 L, 17 LM, 17 LC, 176 MP; 361/407, 413; 324/158 F

[56] References Cited

U.S. PATENT DOCUMENTS

| | | | |
|---|---|---|---|
| 3,334,325 | 8/1967 | Conrad et al. | 361/407 |
| 3,634,814 | 1/1972 | Inacker | 339/17 LM |
| 3,871,728 | 3/1975 | Goodman | 339/14 R |
| 3,927,925 | 12/1975 | Borsuk | 339/17 M |

*Primary Examiner*—Neil Abrams
*Attorney, Agent, or Firm*—George T. Noe

[57] ABSTRACT

An electrical connector apparatus is provided for connection of coaxial transmission lines to etched circuit boards. The apparatus comprises a back plane carrying one or more circuit board edge connectors, a ground plane for engaging a contact on a circuit board plugged into the edge connector, and an arrangement of connector pins which permits most of the edge connector pins to be used for signals while maintaining a high frequency response for subnanosecond pulses.

1 Claim, 3 Drawing Figures

HIGH-FREQUENCY ETCHED CIRCUIT BOARD CONNECTOR

BACKGROUND OF THE INVENTION

The present invention relates generally to electrical connectors, and in particular to connectors for connection of coaxial transmission lines to etched circuit boards.

Automated semiconductor equipment has been developed for fast, efficient, and accurate dynamic testing of new semiconductor devices in a production setting. This equipment measures rise time, fall time, propagation delay, storage time, delay time, and performs other dynamic measurements on the semiconductor devices in order to provide a higher yield of salable devices than can be provided by performing static tests. Such semiconductor test equipment generally includes a plurality of replaceable plug-in probes to accommodate the testing of devices having a wide range of sizes and pin configurations. Typically, a probe largely comprises an etched circuit board with a probe head mounted thereon for receiving the semiconductor devices, and the interface of the probe with the test apparatus is made via conventional circuit board edge connectors. Because testing semiconductor devices frequently involves test signal having frequencies of up to about 700 megahertz and pulse rise times of as little as 500 picoseconds, coaxial cables are utilized to interconnect the process and control circuits of the test apparatus and the test probe. The center conductor of each coaxial cable carries the test signal, while the outer conductor provides a grounded shield.

Circuit board edge connectors provide an inexpensive and reliable method of signal connection. Hitherto, both the signal and ground connection of each cable have been connected via pins to the edge connector to the circuit board, one side of which carried signal paths, or runs, to the probe head and the other side of which provided a ground plane. However, with increasing semiconductor chip sizes and the increasing number of pins on the devices themselves, it is highly desirable to utilize both sides of the etched circuit board for signal runs and nearly all of the pins of the edge connector for signal connection.

SUMMARY OF THE INVENTION

In accordance with the present invention, a high-frequency etched circuit board connector is provided for connecting coaxial transmission lines to etched circuit boards. Ground connections are made to a ground plane which bypasses an etched circuit board edge connector, reserving the edge connector pins for signal connections. Rows of ground pins are disposed adjacent to the edge connector pins to facilitate the use of conventional two-pin terminal connector blocks. An internal layer of a multilayer circuit board is utilized for a ground plane, allowing both outside surfaces of the circuit board to be used for signal paths. Ground connection from the edge connector bypass gound plane to the circuit board internal ground plane is made via a wiping contact which is mounted on the circuit board and engages the bypass ground plane when the circuit board is plugged into the edge connector.

It is therefore one object of the present invention to provide an improved high-frequency etched circuit board connector.

It is another object of the present invention to provide a highfrequency etched circuit board connector which is inexpensive and yet maintains a low-induction ground connection for the transmission of fast-risetime pulses.

It is a further object of the invention to provide a high-frequency etched circuit board connector in which edge connector pins are available for signals while the ground connections are made via a bypass arrangement.

Other objects and advantages will become apparent to those having ordinary skill in the art upon a reading of the following description when taken in conjunction with the accompanying drawings.

DETAILED DESCRIPTION OF THE INVENTION

Figure 1:
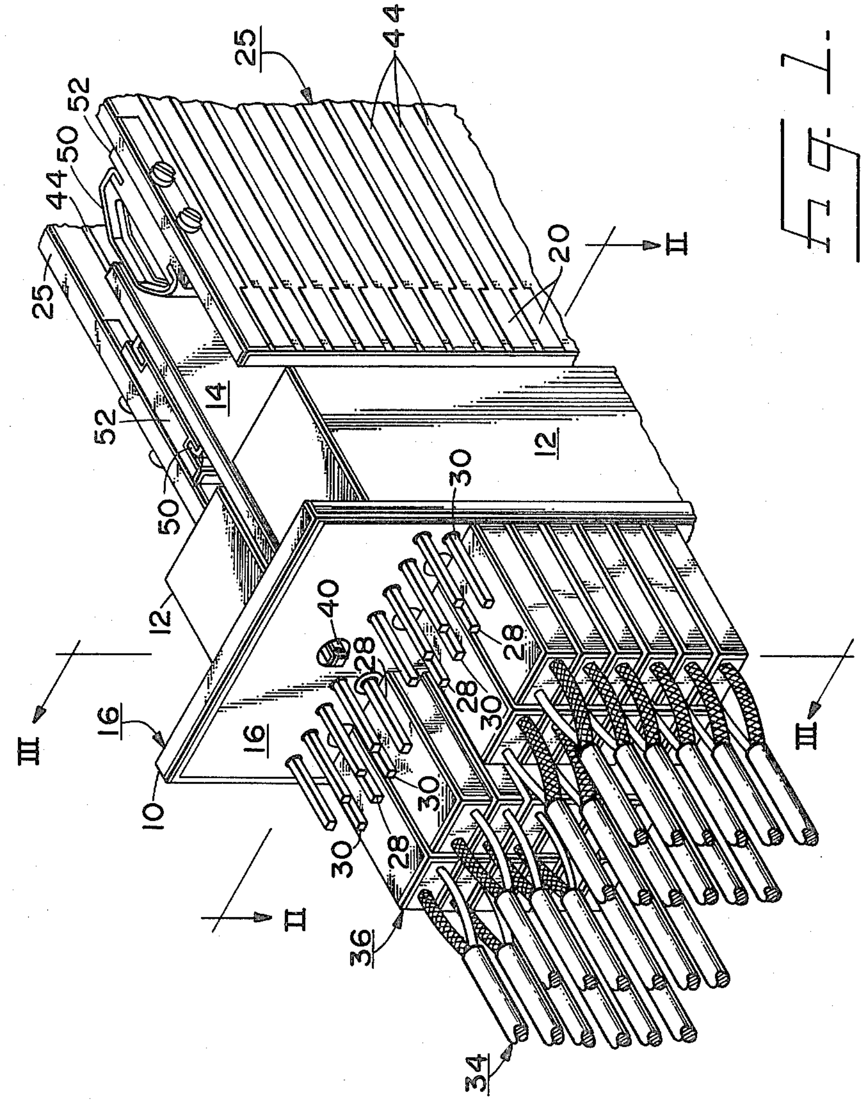
FIG. 1 is a perspective view of a high-frequency etched circuit board connector in accordance with the present invention.
Figure 2:
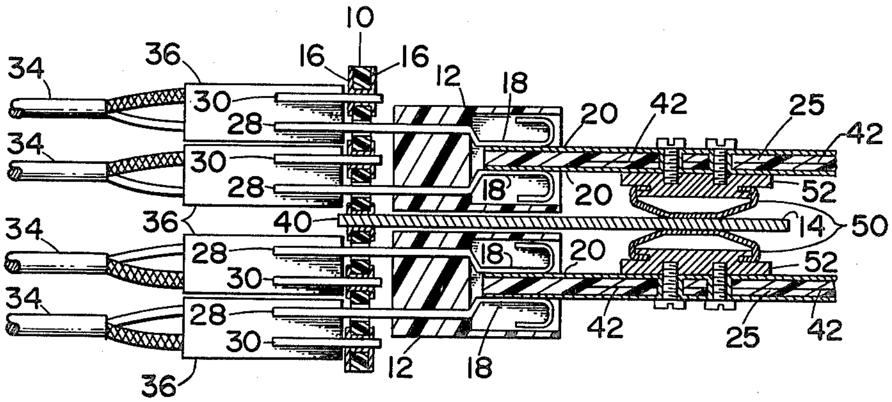
FIG. 2 is a section view of the connector taken along the lines 2—2 of FIG. 1.
Figure 3:
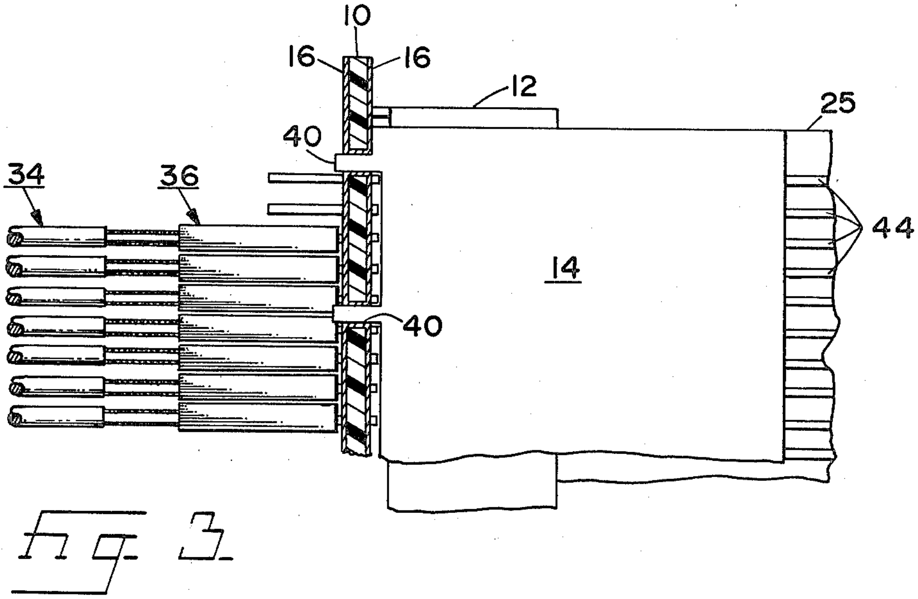
FIG. 3 is a section view of the connector taken along the lines 3—3 of FIG. 1.

The electrical connector apparatus of the present invention is shown in FIGS. 1, 2, and 3, and includes a basic connector assembly which comprises a back plane 10, one or more circuit board edge connectors 12, and a bypass ground plane 14 mounted perpendicular to the back plane and making electrical connection therewith. The back plane 10 suitably may be an etched circut board having metallic planar surfaces 16 on either or both sides of the circuit board to serve as ground planes. The circuit board edge connectors 12 suitably may be of the type having an insulative plastic body containing contraposed rows spring-type wiping contacts 18 for electrical engagement with rows of metallic pads 20 on both sides of a circuit board 25 when the edge of such circuit board is inserted thereinto. Associated with the respective wiping contacts 18 and extending outwardly from the body of the edge connectors 12 are two rows of square pins 28, which are inserted through two rows of holes in the back plane 10. Holes through which signal-carrying square pins 28 of connector 12 extend have the metal of ground planes 16 etched away to ensure insulation from ground, while holes through which ground-connection square pins 30 of connector 12 extend are plated through to provide a conductive connection between ground planes 16 and to permit soldering ground-connection square pins to the back plane 10. Two additional rows of square pins 30, which are not part of connector 12, each row of which is equally spaced from and associated with a row of square pins 28, are inserted into and soldered in place in two additional rows of holes which are plated through to provide ground connection for coaxial cables to the ground plane 10. This arrangement of signal-carrying square pins and ground-connection square pins permits a rather dense, compact connection of coaxial cables 34 to the connector assembly. Coaxial cables 34 are conventional and suitably may include an inner signal-carrying conductor and a grounded outer shield conductor separated by a solid dielectric material, such as plastic, and a protective insulator jacket of plastic material provided over the outer conductor. The bare end of the grounded outer conductor, which may be in the form of braided wire strands, and the bare end of the signal-carrying outer conductor are connected to split-sleeve socket members which are housed in a twoconnector terminal block 36. The terminal block 36 is fitted to the connector assembly in such a manner that the socket members engage respectively a square pin 28 and a square pin 30 to thereby route a signal to an edge connector contact 18 and to connect the coaxial cable outer ground shield to the back plane 10.

Plated-through holes are also provided in the back plane 10 to receive tabs 40 of the bypass ground plane 14, which is fabricated of sheet metal and soldered to the back plane. The bypass ground plane 14 is mounted perpendicular to the back plane 10 and parallel to installed circuit boards 25. Circuit board 25 may suitably be a multilayer circuit board having one or more internal layer 42 which are utilized as ground planes, allowing both outside surfaces of the circuit board to be used for signal paths 44 extending from the metallic pads 20 which engage the wiping contacts 18 when the circuit board 25 is inserted into the edge connector 12. A contact assembly including a resilient contact member 50 and a base support member 52 is provided for establishing electrical contact between the internal ground plane 42 and the bypass ground plane 14. The resilient contact member 50 suitably may be of phosphor-bronze or a similar spring-type high-conductivity metal which is commercially available in pre-formed strips known as fingerstock. The base support member 52 may be a metal block which is fabricated using conventional machining or extrusion techniques. It may be attached to the circuit board by any convenient and viable manner, such as by soldering, or by attaching with screws as shown, to ensure a mechanical and electrical connection. Such a base support member should bridge any signal paths 44 which are on the same side of the circuit boards to avoid shorting. This may be achieved by milling large slots so that the base support member contacts the circuit board only at points where it is to be attached, or by providing appropriate insulation.

In one commercial embodiment which has been designed and tested, two commercially-available 70-pin edge connectors 12 were employed, each accepting a circuit board edge having a 3.5-inch edge length. The two square pins at either end of the edge connectors, as well as two other square pins located halfway between the ends, are soldered to the back plane 10 to mechanically secure the edge connectors to the back plane and to provide additional grounding. The remaining 64 square pins are insulated from the back plane 10 to provide signal inputs. Ground plane 14 is mounted between the edge connectors 12 as shown. This provides a connector assembly having a high frequency response, low standing wave ratio, and low induction to ground.

It will be obvious to those having ordinary skill in the art that many changes may be made in the details of the preferred embodiment of the present invention without departing from the spirit of the present invention. For example, edge connectors of any size may be used, and the assembly may be expanded to include any number of edge connectors to accomodate any desired number of circuit boards. Appropriately, the circuit boards, 25 include contact assemblies 50, 52 on both sides of the board to engage the ground planes 14. Therefore, the scope of the present invention should not only be determined by the following claims.

We claim:

1. An electrical connector apparatus providing a bypass ground connection to an etched circuit board, comprising:

a back plane member having at least one metallic planar surface;

at least one circuit board edge connector assembly attached to said back plane member, said edge connector assembly comprising an insulative body containing contraposed rows of electrical contacts for resiliently engaging the edge of an etched circuit board having metallic pads along said edge, said edge connector assembly further comprising a set of first electrical connector pins electrically connected with respective ones of said electrical contacts extending through holes provided in said back plane member and insulated therefrom to provide signal paths;

a set of second electrical connector pins electrically connected to said back plane member to provide ground connections, said second pins being disposed adjacent said first pins to provide pairs of ground and signal pins; and a bypass ground plane member mounted perpendicular to said back plane member and making electrical connection with the metallic planar surface thereof, said bypass ground plane member being disposed adjacent to the insulative body of said edge connector assembly and extending from the back plane member parallel to the etched circuit board to engage ground contacts carried by the circuit board.

* * * * *